United States Patent
Kim et al.

(10) Patent No.: US 10,224,355 B2
(45) Date of Patent: Mar. 5, 2019

(54) COMPARATOR FOR LOW-BANDING NOISE AND CMOS IMAGE SENSOR INCLUDING THE SAME

(71) Applicant: SK hynix Inc., Gyeonggi-do (KR)

(72) Inventors: Hyeon-June Kim, Jeollanam-do (KR); Tae-Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/902,584

(22) Filed: Feb. 22, 2018

(65) Prior Publication Data

US 2019/0035834 A1   Jan. 31, 2019

(30) Foreign Application Priority Data

Jul. 28, 2017 (KR) ......................... 10-2017-0095979

(51) Int. Cl.
| | |
|---|---|
| *H03M 1/34* | (2006.01) |
| *H01L 27/146* | (2006.01) |
| *H04N 5/378* | (2011.01) |
| *H04N 5/374* | (2011.01) |
| *H04N 5/363* | (2011.01) |
| *H03M 1/00* | (2006.01) |
| *H04N 5/243* | (2006.01) |

(52) U.S. Cl.
CPC .. *H01L 27/14609* (2013.01); *H01L 27/14689* (2013.01); *H03M 1/002* (2013.01); *H04N 5/243* (2013.01); *H04N 5/363* (2013.01); *H04N 5/374* (2013.01); *H04N 5/378* (2013.01)

(58) Field of Classification Search
CPC ............. H03M 1/002; H01L 27/14609; H01L 27/14689; H04N 5/363
USPC ................................ 341/118, 120, 155, 164
See application file for complete search history.

(56) References Cited

U.S. PATENT DOCUMENTS

| | | | | |
|---|---|---|---|---|
| 8,643,750 | B2* | 2/2014 | Mo ..................... | H04N 5/2176 348/222.1 |
| 8,717,474 | B2* | 5/2014 | Shigeta ................. | H04N 5/355 348/255 |
| 9,294,696 | B2* | 3/2016 | Fujinaka ................ | H04N 5/363 |
| 2012/0001059 | A1* | 1/2012 | Ackland ............. | H04N 5/3559 250/214 DC |
| 2014/0160331 | A1* | 6/2014 | Murakami ............ | H04N 5/378 348/300 |

FOREIGN PATENT DOCUMENTS

| KR | 101507199 | 3/2015 |
|---|---|---|
| KR | 101569953 | 11/2015 |

* cited by examiner

*Primary Examiner* — Peguy Jean Pierre
(74) *Attorney, Agent, or Firm* — IP & T Group LLP

(57) ABSTRACT

A comparator may include: a comparison block suitable for comparing a ramp signal and a pixel signal and outputting a comparison signal; and a gain acquisition and noise reduction block suitable for amplifying the comparison signal outputted from the comparison block to acquire a gain and reduce an occurrence of noise.

18 Claims, 7 Drawing Sheets

COMPARATOR FOR LOW-BANDING NOISE AND CMOS IMAGE SENSOR INCLUDING THE SAME

CROSS-REFERENCE TO RELATED APPLICATIONS

The present application claims priority to Korean Patent Application No. 10-2017-0095979, filed on Jul. 28, 2017, which is incorporated herein by reference in its entirety.

BACKGROUND

1. Field

Exemplary embodiments of the present invention relate to a comparator which can increase a gain while reducing banding noise, and can reduce the area and power consumption because no buffers are used.

2. Description of the Related Art

In general, a complementary metal oxide semiconductor (CMOS) Image Sensor (abbreviated as "CIS") requires the operation of converting an analog signal (e.g., pixel signal $V_{PIXEL}$) outputted from a pixel array into a digital signal, unlike a solid-state imaging device. In order to convert an analog signal into a digital signal, the CIS uses a high-resolution Analog-to-Digital Converter (ADC).

The CIS may be divided into a CIS using a single ADC and a CIS using column ADCs, depending on the implementation schemes of the ADCs.

The CIS that uses a single ADC converts analog signals outputted from all columns of a pixel array into digital signals within a predetermined time, using one ADC which operates at high speed. The CIS that uses a single ADC can reduce the chip area thereof, but may have high power consumption because the ADC must operate at high speed.

On the other hand, the CIS that uses column ADCs includes a plurality of ADCs with a simple structure (for example, single-slope ADCs), which are arranged at the respective columns. The CIS that uses column ADCs may increase the chip area thereof, but have low power consumption because each of the ADCs may operate at low speed.

The CIS using column ADCs performs correlated double sampling (CDS) on an analog output voltage which is an output signal of the pixel array, stores the resultant voltage, compares the voltage stored through the CDS to a predetermined ramp signal in response to a ramp signal generated by a ramp signal generator, and provides a comparison signal for generating a digital code.

This operation is described in more detail with a single-slope ADC taken as an example.

First, the single-slope ADC uses an operational transconductance amplifier (OTA) using five or more transistors or an inverter-type comparator using two or more transistors. If necessary, the single-slope ADC may use first to third comparators.

More specifically, the first comparator of the single-slope ADC receives a ramp signal through one input transistor of two input transistors, and receives a pixel signal $V_{PIXEL}$ through the other input transistor. In the input transistors of the comparator, the sizes of a gate-source parasitic capacitor Cgs and drain-source parasitic capacitor Cds are changed depending on an operation region.

The ramp signal generator considers input terminals of comparators of several tens to several thousands of single-slope ADCs as loads, and is driven one step by one step in operation.

During the operation, the gate voltage of the input transistor receiving the ramp signal falls by one step. When the falling gate voltage (e.g., the ramp signal) becomes equal to the gate voltage (e.g., the pixel signal $V_{PIXEL}$) of the input transistor receiving the pixel signal $V_{PIXEL}$, the comparator outputs a comparison result signal, a counter performs counting, and a memory stores the counting value.

However, although the comparator outputs the comparison result signal, the ramp signal is inputted while falling by one step, until the ramp signal reaches a preset range. Thus, the gate voltage of the input transistor receiving the ramp signal continuously falls.

Thus, the voltage of an output node of the input transistor receiving the pixel signal $V_{PIXEL}$ also continuously falls, and the operation region of the input transistor receiving the pixel signal $V_{PIXEL}$ is changed from a saturation region to a triode region or linear region. That is, the input transistor receiving the pixel signal $V_{PIXEL}$ may be considered as a resistor, due to a reduction in drain-source voltage Vds of the input transistor receiving the pixel signal $V_{PIXEL}$.

Therefore, the common voltage Vcm of the input transistor receiving the ramp signal and the input transistor receiving the pixel signal $V_{PIXEL}$ may be significantly changed. Then, the gate-source parasitic capacitor Cgs of the input transistor receiving the ramp signal may be significantly changed.

Since the load of the ramp signal generator is changed depending on the operation states of the respective comparators, banding noise may occur. The banding noise may be defined as non-linear noise which is caused when the operation state of each circuit affects other peripheral circuits.

Therefore, in order to reduce the occurrence of banding noise, an isolation buffer is additionally installed between the output terminal of the ramp signal generator and the input terminal of each comparator, such that the ramp signal is inputted to the comparator through the buffer.

However, this buffer addition scheme may increase the area and power consumption because the buffer is used to reduce an occurrence of banding noise. Furthermore, an input swing may be reduced by a gain error of the buffer.

SUMMARY

Various embodiments are directed to a comparator capable of changing a gain occurrence location and controlling input transistors to operate in a saturation region, and a CIS including the same.

In an embodiment, a comparator may include: a comparison block suitable for comparing a ramp signal and a pixel signal and outputting a comparison signal; and a gain acquisition and noise reduction block suitable for amplifying the comparison signal outputted from the comparison block to acquire a gain and reduce an occurrence of noise.

In an embodiment, an image sensor may include: a pixel array suitable for outputting a pixel signal corresponding to incident light; a row decoder suitable for selecting a pixel in the pixel array for each row line and controlling the selected pixel, according to control of a control unit; a ramp signal generator suitable for generating a ramp signal according to control of the control unit; a comparison block suitable for comparing the ramp signal applied from the ramp signal generator with pixel signals applied from the pixel array according to control of the control unit; an gain acquisition and noise reduction block suitable for amplifying a comparison signal applied from the comparison block to acquire a gain and reduce an occurrence of noise; a counting unit suitable for counting a clock applied from the control unit according to each of output signals from the gain acquisition and noise reduction block; a memory unit suitable for storing counting information provided from the counting unit according to control of the control unit; the control unit suitable for controlling operations of the row decoder, the ramp signal generator, the comparison block, the counting unit, the memory unit and a column readout circuit; and the column readout circuit suitable for outputting data of the memory unit according to control of the control unit.

DETAILED DESCRIPTION

Figure 1A:
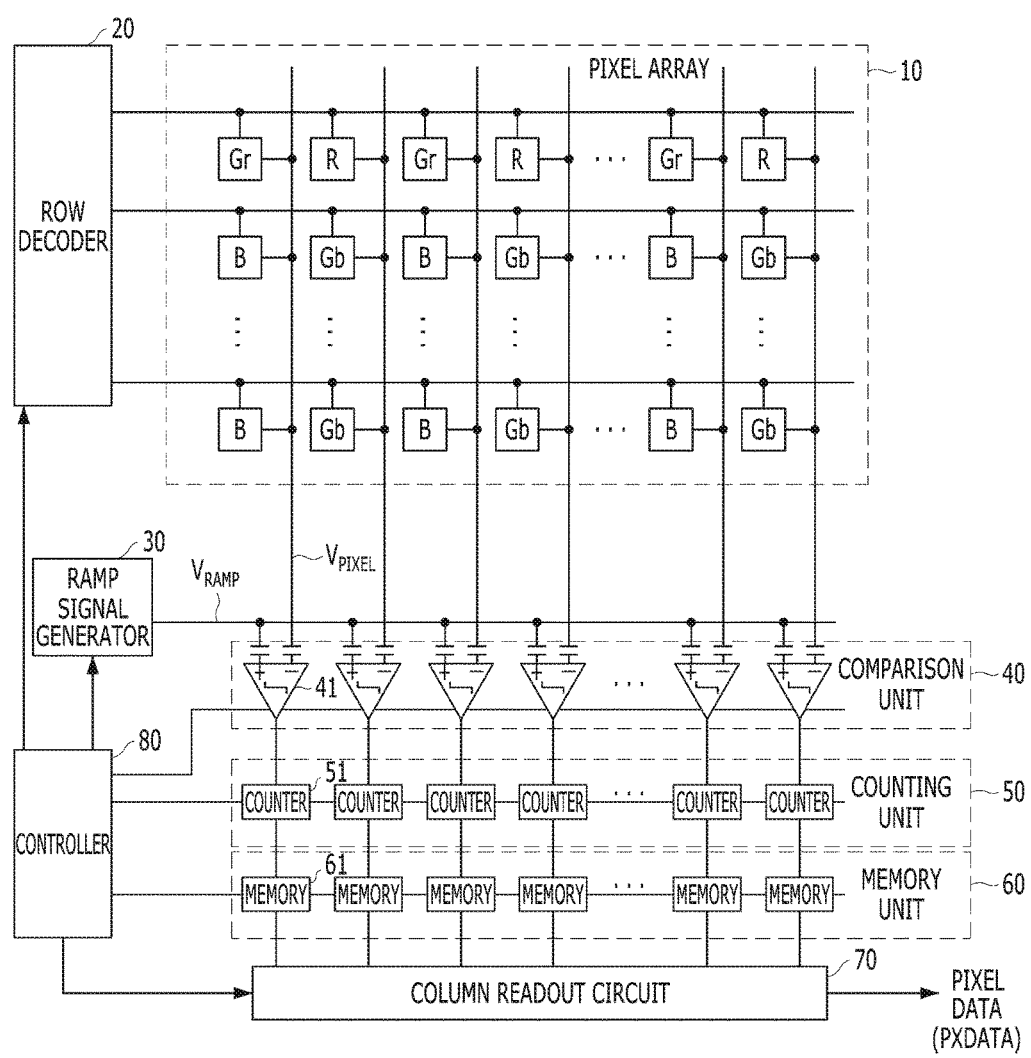
FIG. 1A is an exemplary configuration of a CIS for promoting understandings of an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The terminology used herein is for the purpose of describing particular embodiments only and is not intended to be limiting of the present invention.

Throughout the specification, when one element is referred to as being 'connected to' or 'connected to' another element, it may not only indicate that the former element is directly connected or connected to the latter element, but also indicate that another element is interposed therebetween. Furthermore, when an element "comprises" or "has" a component, it may indicate that the element does not exclude another component but can further comprise or have another component, unless referred to the contrary. Furthermore, although components described in the specification are represented in the form of a singular form, the present embodiment is not limited thereto, but each of the components may include a plurality of components.

Hereinafter, the various embodiments of the present invention will be described in detail with reference to the attached drawings.

Figure 1B:
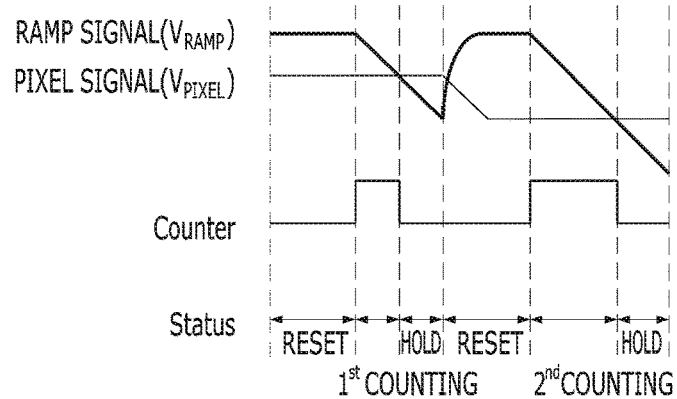
FIG. 1B is an analog-to-digital conversion timing diagram of the CIS illustrated in FIG. 1A.

FIG. 1A is a configuration diagram of a CIS for promoting understandings of an embodiment, illustrating a column-parallel CIS using a general single-slope ADC. FIG. 1B is an analog-to-digital conversion timing diagram of the CIS illustrated in FIG. 1A.

As illustrated in FIG. 1A, the CIS in accordance with one exemplary embodiment may include a pixel array 10, a row decoder 20, a ramp signal generator 30, a comparison unit 40, a counting unit 50, a memory unit 60, a controller 80, and a column readout circuit 70. The pixel array 10 may output a pixel signal $V_{PIXEL}$ corresponding to incident light. The row decoder 20 may select pixels in the pixel array 10 for each row line and control operations of the selected pixels, according to control of the controller 80 (for example, timing generator). The ramp signal generator 30 may generate a ramp signal according to control of the controller 80. The comparison unit 40 may compare the value of the ramp signal applied from the ramp signal generator 30 with the values of pixel signals $V_{PIXEL}$ outputted from the pixel array 10 according to control of the controller 80. The counting unit 50 may count a clock applied from the controller 80 according to each of output signals of the comparison unit 40. The memory unit 60 may store the counting information provided from the counting unit 50 according to control of the controller 80. The controller 80 may control the operations of the row decoder 20, the ramp signal generator 30, the comparison unit 40, the counting unit 50, the memory unit 60, and the column readout circuit 70. The column readout circuit 70 may sequentially output data of the memory unit 60 as pixel data PXDATA according to control of the controller 80.

At this time, in order to remove the offset value of a pixel, the CIS may compare pixel signals $V_{PIXEL}$ (pixel output voltages) before and after a light signal is incident, and measure only an actual pixel signal $V_{PIXEL}$ generated by incident light. Such an operation may be referred to as correlated double sampling (CDS). The CDS may be performed by the comparison unit 40.

The comparison unit 40 may include a plurality of comparators, and the counting unit 50 may include a plurality of counters, while the memory unit 60 may include a plurality of memories. That is, the comparators, the counters, and the memories may be installed at the respective columns.

Next, referring to FIGS. 1A and 1B, the operations of one comparator, one counter, and one memory will be described as follows.

At first, the first comparator 41 may receive a pixel signal $V_{PIXEL}$ outputted from the first column of the pixel array 10 through one terminal thereof, receive a ramp signal $V_{RAMP}$ applied from the ramp signal generator 30 through the other terminal thereof, compare the values of the two signals according to a control signal from the controller 80, and output a comparison signal.

Since the ramp signal $V_{RAMP}$ has a voltage level that decreases or increases by the predetermined magnitude with time after initialization, the values of two signals inputted to the comparator 41 may coincide with each other at a certain point in time. After the point in time that the values of the two signals coincide with each other, the comparison signal outputted from the comparator 41 may be inverted.

Therefore, the first counter 51 may count the clock applied from the controller 80 from the time point when the ramp signal $V_{RAMP}$ begins to fall to the time point when the comparison signal outputted from the comparator 41 is inverted, and output the counting information. Each of the counters may be reset according to a reset control signal from the controller 80.

Then, the first memory 61 may store the counting information provided from the counter 51 according to a load control signal applied from the controller 80, and output the stored counting information to the column readout circuit 70.

At this time, as illustrated in FIG. 1B, the CIS may perform first counting on a reset signal (reset voltage), and perform second counting on an image signal (signal voltage).

Figure 2A:
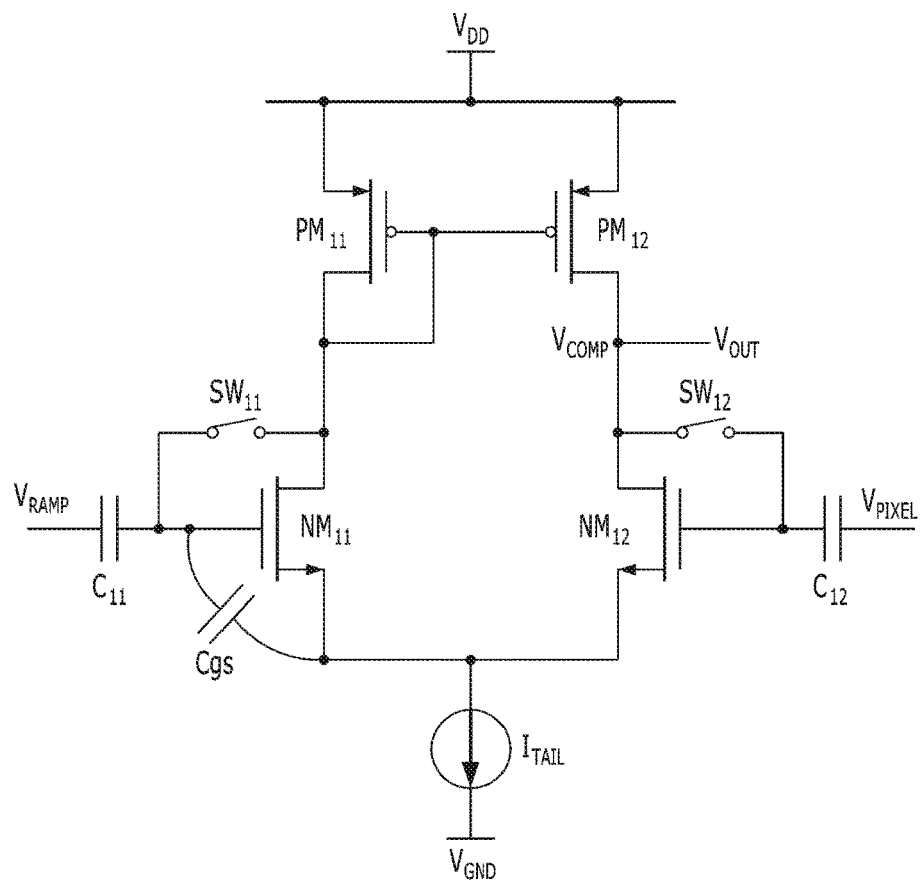
FIG. 2A illustrates an exemplary configuration of a comparator of FIG.
Figure 2B:
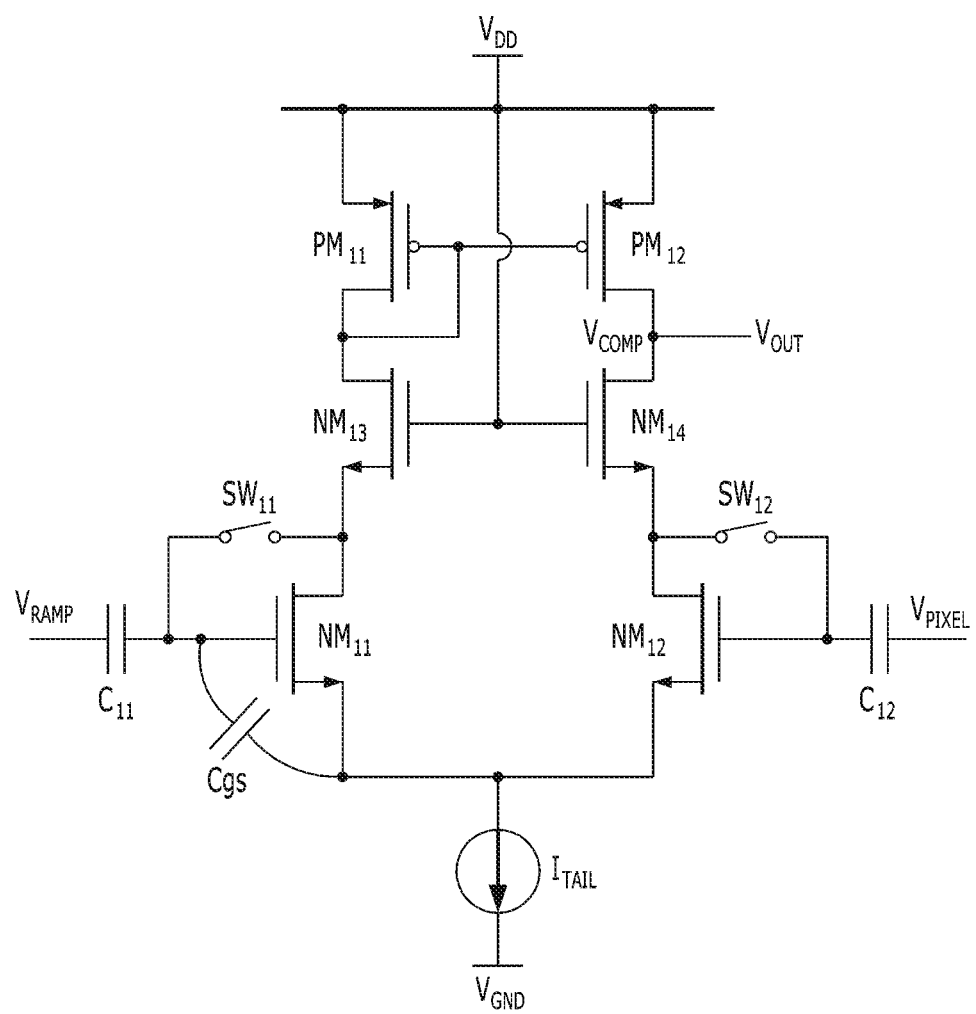
FIG. 2B illustrates an exemplary configuration of the comparator of FIG. 1A.

FIG. 2A illustrates an exemplary configuration of the comparator 41 of FIG. 1A. FIG. 2B illustrates another exemplary configuration of the comparator 41 of FIG. 1A with one embodiment.

As illustrated in FIG. 2A, the comparator 41 may include PMOS transistors $PM_{11}$ and $PM_{12}$, capacitors $C_{11}$ and $C_{12}$, NMOS transistors $NM_{11}$ and $NM_{12}$, and switches $SW_{11}$ and $SW_{12}$. The PMOS transistor $PM_{11}$ may have a diode-connection structure in which a source terminal thereof is connected to a first supply voltage $V_{DD}$, and gate and drain terminals thereof are connected to each other. The PMOS transistor $PM_{12}$ may have a source terminal connected to the first supply voltage $V_{DD}$, a gate terminal connected to the gate terminal of the PMOS transistor $PM_{11}$, and a drain terminal connected to an output node. The capacitor $C_{11}$ may have one terminal that may receive a ramp signal (ramp voltage) $V_{RAMP}$ and the other terminal connected to the gate terminal of the NMOS transistor $NM_{11}$, and the capacitor $C_{12}$ may have one terminal that may receive a pixel signal $V_{PIXEL}$ (pixel voltage) Vpixel and the other terminal connected to the gate terminal of the NMOS transistor $NM_{12}$. The NMOS transistor $NM_{11}$ may have a drain terminal connected to the drain terminal of the PMOS transistor $PM_{11}$, a gate terminal connected to the other terminal of the capacitor $C_{11}$, and a source terminal connected to a second supply voltage $V_{GND}$ through a current source $I_{Tail}$, and the NMOS transistor $NM_{12}$ may have a drain terminal connected to the output node, a gate terminal connected to the other terminal of the capacitor $C_{12}$, and a source terminal connected to the second supply voltage $V_{GND}$ through the current source $I_{Tail}$. The switch $SW_{11}$ may be connected between the drain and gate terminals of the NMOS transistor $NM_{11}$, and the switch $SW_{12}$ may be connected between the drain and gate terminals of the NMOS transistor $NM_{12}$.

Next, referring to FIG. 2A, the operation of the comparator 41 will be described as follows. In order to perform CDS on the pixel signal $V_{PIXEL}$, the switches $SW_{11}$ and $SW_{12}$ may be turned on to sample a reset voltage $V_{RESET}$ of the pixel signal $V_{PIXEL}$ (i.e., reset voltage+signal voltage).

Thus, the voltage levels of the gate and drain terminals of the NMOS transistors $NM_{11}$ and $NM_{12}$ may become equal, and the voltage levels of the drain terminals of the PMOS transistors $PM_{11}$ and $PM_{12}$ may become equal.

In the comparator illustrated in FIG. 2A, a common voltage Vcm of the ramp signal $V_{RAMP}$ may be sampled in the capacitor $C_{ii}$ and the reset voltage of the pixel signal $V_{PIXEL}$ may be sampled in the capacitor $C_{12}$, based on an offset signal which is inherently generated in the circuit configuration.

The common voltage Vcm of the ramp signal $V_{RAMP}$ and the reset voltage of the pixel signal $V_{PIXEL}$, which are inputted to the comparator, may be held by the gate terminals of the NMOS transistors $NM_{11}$ and $NM_{12}$, and a change of the ramp signal $V_{RAMP}$ or the pixel signal $V_{PIXEL}$ may be sensed in the form of AC coupling through the capacitors $C_{11}$ and $C_{12}$. This configuration will be described in more detail as follows.

In order to sample the signal voltage Vsignal of the pixel signal VPIXEL (i.e., reset voltage+signal voltage), the switches $SW_{11}$ and $SW_{12}$ may be turned off.

At this time, a switching noise signal caused by instantaneous switching may be stored in the capacitors $C_{11}$ and $C_{12}$. However, when the switches $SW_{11}$ and $SW_{12}$ are turned off, each of signals across the switches may have a constant value at all times. Thus, the signals may be considered as offset signals. Furthermore, since the NMOS transistors $NM_{11}$ and $NM_{12}$ have a differential structure, the signals may offset each other. Ideally, the signals may be considered as '0'. In an actual circuit, however, the signals may not have a value of '0'. Thus, the switching noise generated at this time may reduce the resolution of an image. The reduction in resolution of the image may be minimized by a digital double sampling (DDS) operation, which offsets the switching noise through a difference between a code value obtained by sampling the reset voltage and a code value obtained by sampling the signal voltage.

When the switches $SW_{11}$ and $SW_{12}$ are turned off and a signal voltage from a pixel is AC-coupled through the capacitor $C_{12}$ and applied to the gate terminal of the NMOS transistor $NM_{12}$, the voltage level of 'reset voltage-signal voltage' may be sampled in the gate terminal of the NMOS transistor $NM_{12}$.

Then, the ramp signal $V_{RAMP}$ may be AC-coupled through the capacitor $C_{11}$ and applied to the gate terminal of the NMOS transistor $NM_{11}$. At this time, as the voltage level of the ramp signal $V_{RAMP}$ falls or rises, the gate voltages of the NMOS transistors $NM_{11}$ and $NM_{12}$ may coincide with each other at a certain point in time.

When the gate voltage of the NMOS transistor $NM_{11}$ to which the ramp signal $V_{RAMP}$ is applied crosses the gate voltage of the NMOS transistor $NM_{12}$ to which the CDS value (i.e., reset voltage—signal voltage) of the pixel signal $V_{PIXEL}$ is applied, an output voltage VOUT of the output node may fall or rise by 'gain×voltage difference between NMOS transistors $NM_{11}$ and $NM_{12}$'. The comparator may compare the ramp signal $V_{RAMP}$ and the pixel signal $V_{PIXEL}$, and output a comparison signal $V_{COMP}$. The comparison signal $V_{COMP}$ is loaded to the output node.

At this time, a kick-back error may occur to lower the resolution of an image. When the kick-back error occurs, a change of the output voltage may have an influence on a parasitic capacitor that exists inherently in hardware of the gate terminal of the NMOS transistor $NM_{12}$.

Therefore, the comparator may be implemented in a different manner as illustrated in FIG. 2B, in order to minimize the influence of the change of the output voltage due to the parasitic capacitor that exists in the gate terminal of the NMOS transistor $NM_{12}$.

As illustrated in FIG. 2B, the comparator in accordance with one exemplary embodiment may further include NMOS transistors $NM_{13}$ and $NM_{14}$, in addition to the components of the comparator of FIG. 2A. The NMOS transistor $NM_{13}$ may have a drain terminal connected to the drain terminal of the PMOS transistor $PM_{11}$, a gate terminal connected to the first supply voltage $V_{DD}$, and a source terminal connected to the drain terminal of the NMOS transistor $NM_{11}$. Further, the NMOS transistor $NM_{14}$ may have a drain terminal connected to the output node, a gate terminal connected to the first supply voltage $V_{DD}$, and a source terminal connected to the drain terminal of the NMOS transistor $NM_{12}$.

The comparator of FIG. 2B may further include the NMOS transistors $NM_{13}$ and $NM_{14}$ to minimize the occurrence of kick-back error (i.e., kick-back noise).

Even after the gate voltage of the NMOS transistor $NM_{11}$ crosses the gate voltage of the NMOS transistor $NM_{12}$, since the ramp signal $V_{RAMP}$ may continue to fall or rise by one step, or may fall or rise to a predetermined full voltage level, the gate voltage of the NMOS transistor $NM_{11}$ may continuously fall or rise. Therefore, the output voltage VOUT of the output node may fall or rise by 'gain×voltage difference between NMOS transistors $NM_{11}$ and $NM_{12}$'. Then, the operation region of the NMOS transistor $NM_{12}$ may be changed from the saturation region to the triode region or linear region. The comparator may compare the ramp signal $V_{RAMP}$ and the pixel signal $V_{PIXEL}$, and output a comparison signal $V_{COMP}$. The comparison signal $V_{COMP}$ is loaded to the output node.

As a result, the common voltage Vcm of the NMOS transistors $NM_{11}$ and $NM_{12}$ may be significantly changed, and the gate-source parasitic capacitor Cgs of the NMOS transistor $NM_{11}$ may be significantly changed.

As such, the change of the common voltage Vcm may have an influence on the ramp signal $V_{RAMP}$ through the capacitor $C_{11}$, or the load of the ramp signal generator may be changed depending on the operation state of each of the comparators, which will thus have an influence on the analog-digital conversion processes of other comparators around the comparator. The influence may appear as banding noise, and lower the resolution of an image.

Figure 3:
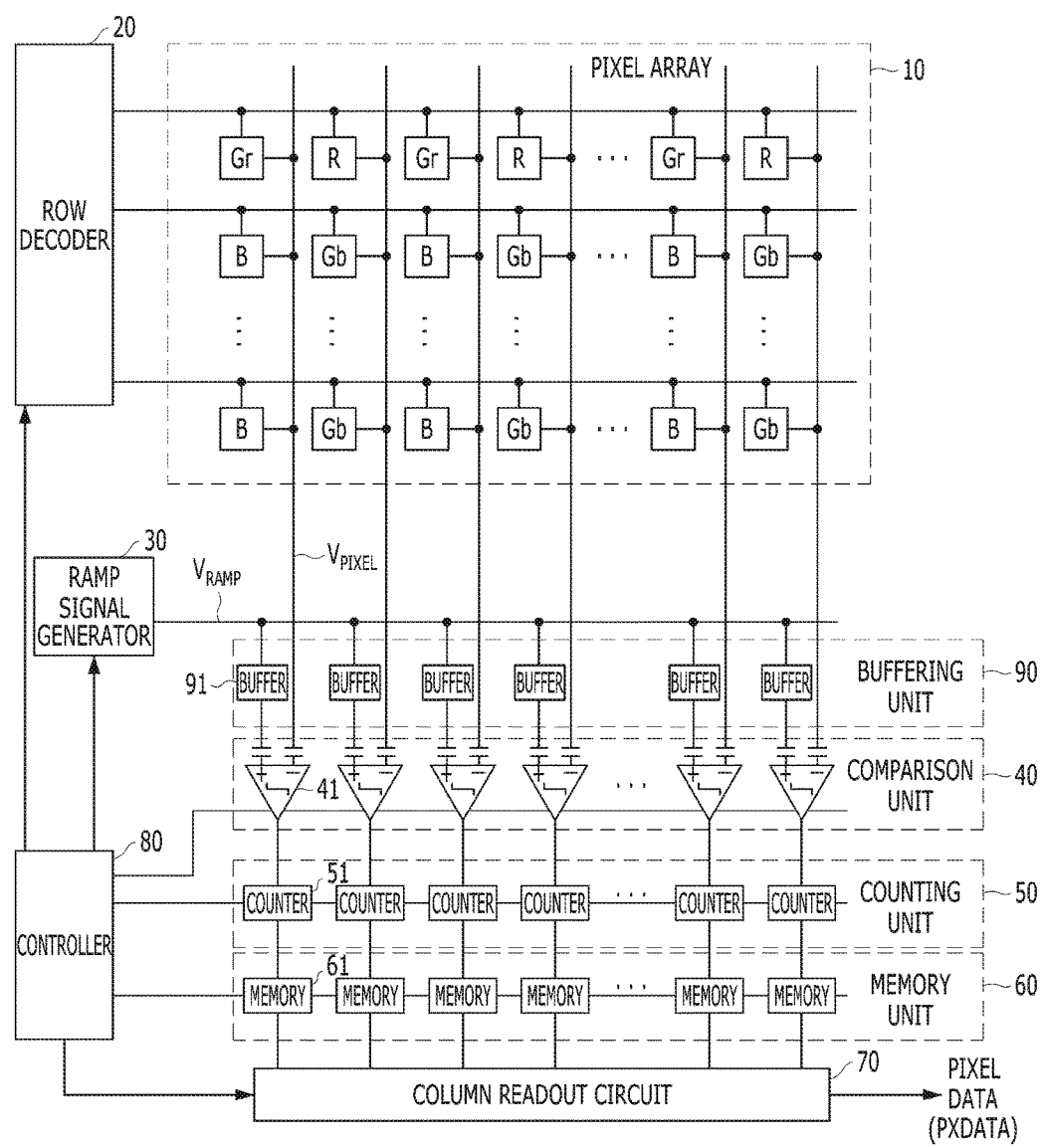
FIG. 3 is an exemplary configuration of a CIS for promoting understandings of the present embodiment.

Therefore, in order to reduce an occurrence of banding noise, the CIS may be implemented in a different manner as illustrated in FIG. 3.

FIG. 3 illustrates another exemplary configuration of a CIS for promoting understandings of an embodiment.

As illustrated in FIG. 3, the CIS in accordance with one embodiment may further include a buffering unit 90 that buffers the ramp signal $V_{RAMP}$ applied from the ramp signal generator 30 and outputs the buffered signal to the comparison unit 40, in addition to the components of the CIS of FIG. 1A.

The buffering unit 90 may include a plurality of buffers. That is, the buffers may be installed at the respective columns.

At this time, the first buffer 91 may receive the ramp signal $V_{RAMP}$ applied from the ramp signal generator 30, buffer the received signal, and output the buffered signal to the comparator 41.

As such, the isolation buffer 91 for reducing banding noise may be additionally installed between the output terminal of the ramp signal generator 30 and the input terminal of the comparator 41, such that the ramp signal $V_{RAMP}$ is inputted to the comparator 41 through the buffer 91. Thus, an occurrence of banding noise can be reduced.

However, this buffer addition scheme may increase the area and power consumption, because the buffers are used to suppress the occurrence of banding noise. Furthermore, the input swing may be reduced by gain errors of the buffers.

In accordance with one exemplary embodiment, the gain generation location may be changed to control the input transistors to operate in the saturation region. Thus, an occurrence of banding noise may be reduced while the gain is increased, and the area and power consumption can be reduced because no buffers are used. Furthermore, the reduction of the input swing by gain errors of the buffers can be suppressed. This will be described in detail with reference to FIGS. 4 to 6.

Figure 4:
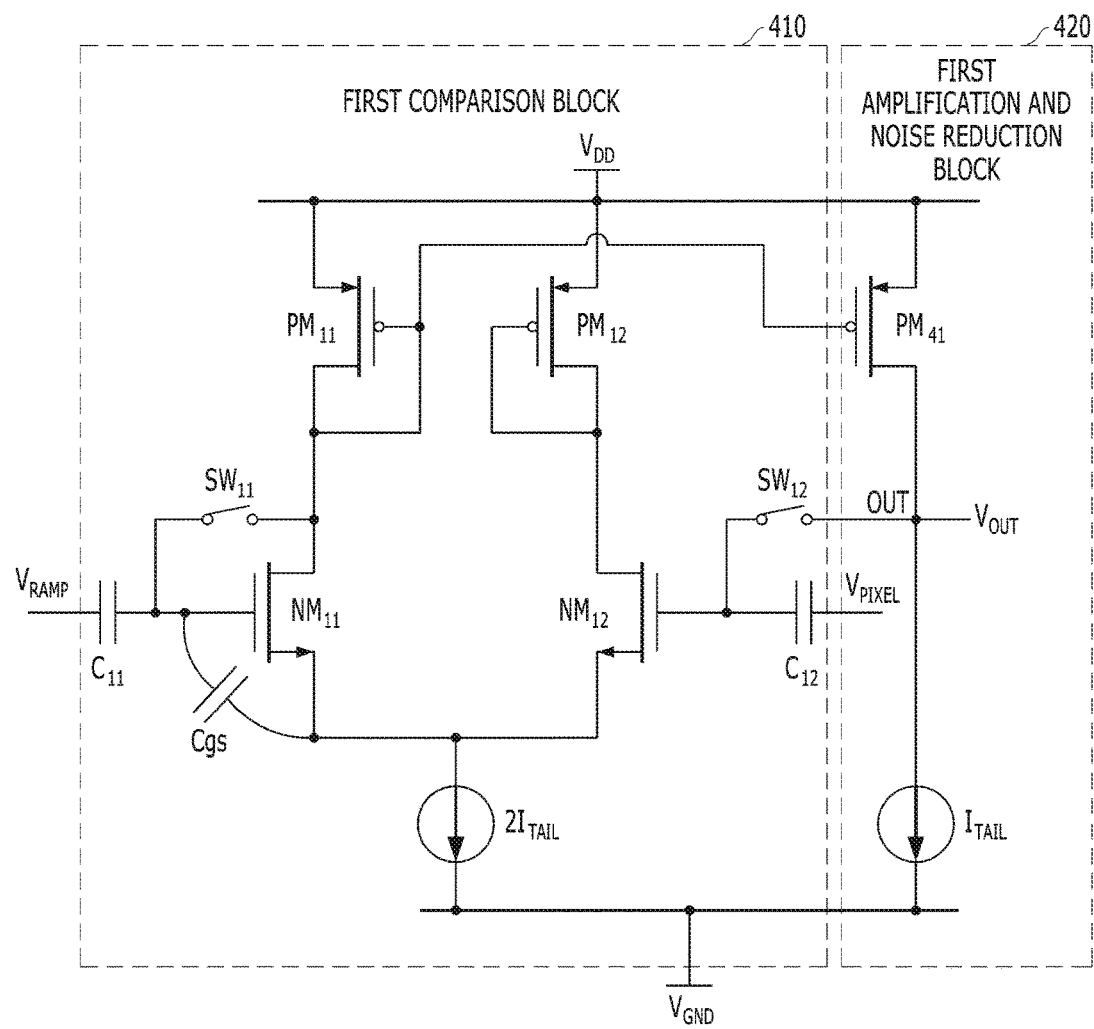
FIG. 4 is a configuration diagram illustrating a comparator in accordance with an embodiment of the present disclosure.

FIG. 4 is an exemplary configuration of a comparator in accordance with one embodiment of the present disclosure.

As illustrated in FIG. 4, the comparator in accordance with one embodiment may include a first comparison block 410 and a first gain acquisition and noise reduction block (i.e. a first gain acquisition and noise reduction block) 420. The first comparison block 410 may compare a ramp signal $V_{RAMP}$ and a pixel signal $V_{PIXEL}$, and output a comparison signal $V_{COMP}$. The first gain acquisition and noise reduction block 420 may acquire a gain by amplifying the comparison signal $V_{COMP}$ from the first comparison block 410, and reduce an occurrence of noise.

At this time, the first comparison block 410 may include PMOS transistors $PM_{11}$ and $PM_{12}$, capacitors $C_{11}$ and $C_{12}$, NMOS transistors $NM_{11}$ and $NM_{12}$, and switches $SW_{11}$ and $SW_{12}$. The PMOS transistor $PM_{11}$ may have a diode-connection structure in which a source terminal thereof is connected to a first supply voltage $V_{DD}$ and gate and drain terminals thereof are connected to each other, and the PMOS transistor $PM_{12}$ may have a diode-connection structure in which a source terminal thereof is connected to the first supply voltage $V_{DD}$ and gate and drain terminals thereof are connected to each other. The capacitor $C_{11}$ may have one terminal that may receive a ramp signal $V_{RAMP}$ and the other terminal connected to a gate terminal of the NMOS transistor $NM_{11}$, and the capacitor $C_{12}$ may have one terminal that may receive a pixel signal $V_{PIXEL}$ and the other terminal connected to a gate terminal of the NMOS transistor $NM_{12}$. The NMOS transistor $NM_{11}$ may have a drain terminal connected to the drain terminal of the PMOS transistor $PM_{11}$, a gate terminal connected to the other terminal of the capacitor $C_{11}$, and a source terminal connected to a second supply voltage $V_{GND}$ through a first current source and the NMOS transistor $NM_{12}$ may have a drain terminal connected to the drain terminal of the PMOS transistor $PM_{12}$, a gate terminal connected to the other terminal of the capacitor $C_{12}$, and a source terminal connected to the second supply voltage $V_{GND}$ through the first current source $2I_{Tail}$. The switch $SW_{11}$ may be connected between the drain and gate terminals of the NMOS transistor $NM_{ii}$, and the switch $SW_{12}$ may be connected between the gate terminal of the NMOS transistor $NM_{12}$ and the output node OUT.

The first gain acquisition and noise reduction block (or the first gain acquisition and noise reduction block) 420 may receive a voltage change the comparison signal $V_{COMP}$ from the first comparison block 410 as a current gain, additionally acquire a gain by amplifying the current gain, and reduce an occurrence of banding noise and kick-back noise.

At this time, the first gain acquisition and noise reduction block 420 may include a PMOS transistor $PM_{41}$ and a second current source $I_{Tail}$. The PMOS transistor $PM_{41}$ may have a source terminal connected to the first supply voltage $V_{DD}$, a gate terminal of the PMOS transistor $PM_{41}$ connected to the first comparison block 410 (i.e., the drain terminal of the PMOS transistor $PM_{11}$), and a drain terminal connected to the output node OUT. The second current source $I_{Tail}$ may be connected between the output node OUT and the second supply voltage $V_{GND}$.

The comparator of FIG. 4 may acquire a CDS value of the pixel signal $V_{PIXEL}$ by sequentially applying the reset voltage and the signal voltage of the pixel signal $V_{PIXEL}$ to the capacitor $C_{12}$ and perform analog-to-digital conversion by applying the ramp signal $V_{RAMP}$ through the capacitor $C_{11}$, according to the same principle as the comparator of FIG. 2A. However, the comparator of FIG. 4 may acquire a voltage gain for a voltage difference between the NMOS transistors $N_{M11}$ and $NM_{12}$ in the first comparison block 410 according to a different principle from the comparator of FIG. 2A.

In the comparator of FIG. 2A, the drain terminals of the NMOS transistors $NM_{ii}$ and $NM_{12}$ may acquire and amplify a current-voltage gain. In the comparator of FIG. 4, however, the PMOS transistors $PM_{11}$ and $PM_{12}$ may have a diode-connection structure in which a change in gate voltage of the PMOS transistor $PM_{11}$ may be applied as a current gain to the gate terminal of the PMOS transistor $PM_{41}$ and then amplified and copied, and the corresponding current may flow through the drain terminal of the PMOS transistor $PM_{41}$.

By this operation, the operation regions of the NMOS transistors $NM_{11}$ and $NM_{12}$ can be maintained to reduce banding noise. Furthermore, the influence of the change in output voltage VOUT of the output node OUT on the parasitic capacitor that exists in the gate terminal of the NMOS transistor $NM_{12}$ can be minimized to reduce an occurrence of kick-back error (kick-back noise). Therefore, the comparator can minimize the area or power consumption, when compared to a comparator that applies the ramp signal $V_{RAMP}$ through the buffers.

Figure 5:
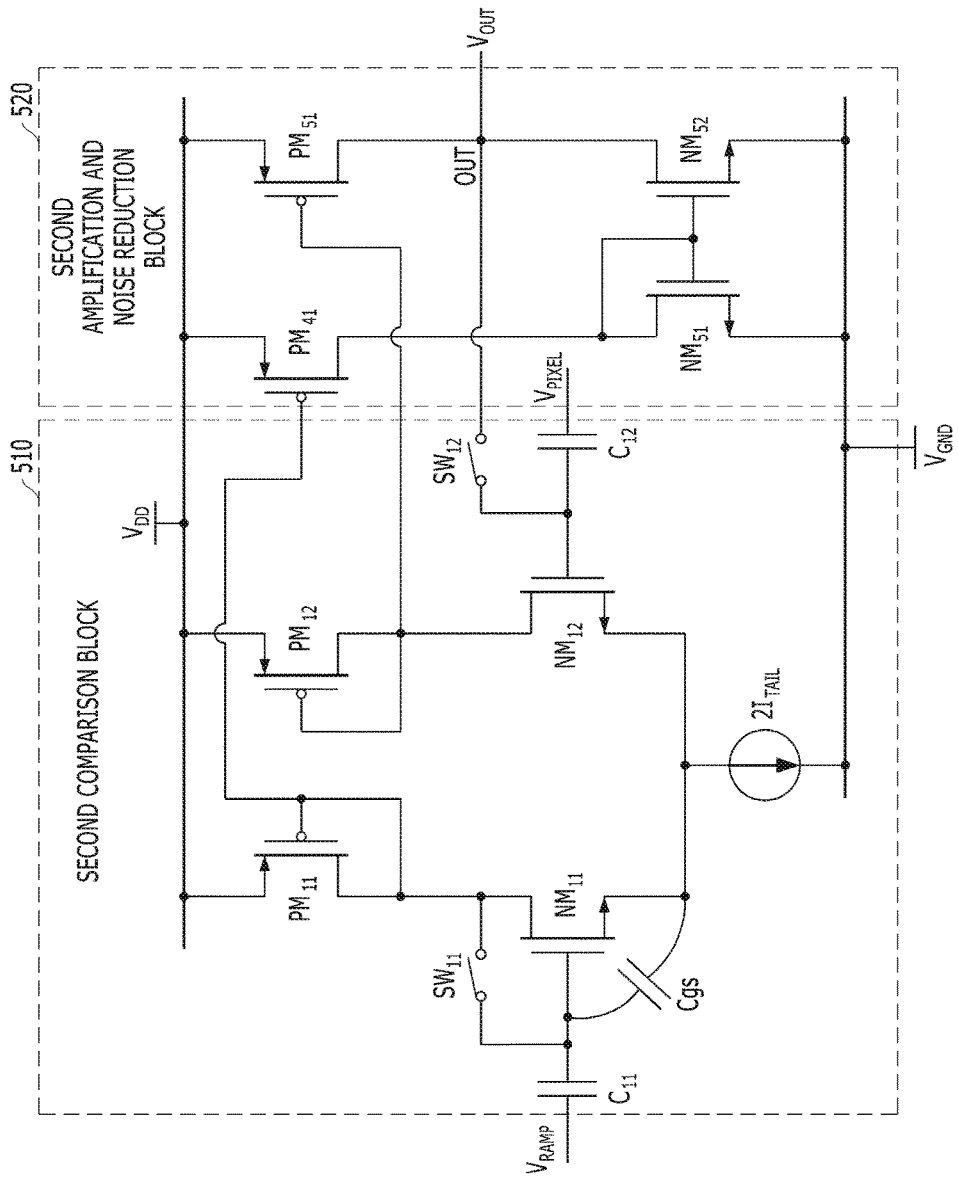
FIG. 5 is a configuration diagram illustrating a comparator in accordance with an embodiment of the present disclosure.

FIG. 5 is an exemplary configuration of a comparator in accordance with one embodiment of the present disclosure.

As illustrated in FIG. 5, the comparator in accordance with one embodiment may include a second comparison block 510 and a second gain acquisition and noise reduction block (i.e. a second gain acquisition and noise reduction block) 520. The second comparison block 510 and the second gain acquisition and noise reduction block 520 may have substantially the same or a similar function as the first comparison block 410 and the first gain acquisition and noise reduction block 420 of FIG. 4 as a whole, but have a different configuration.

The second comparison block 510 may include PMOS transistors $PM_{11}$ and $PM_{12}$, capacitors $C_{11}$ and $C_{12}$, NMOS transistors $NM_{11}$ and $NM_{12}$, and switches $SW_{11}$ and $SW_{12}$. The PMOS transistor $PM_{11}$ may have a diode-connection structure in which a source terminal thereof is connected to the first supply voltage $V_{DD}$ and gate and drain terminals thereof are connected to each other, and the PMOS transistor $PM_{12}$ may have a diode-connection structure in which a source terminal thereof is connected to the first supply voltage $V_{DD}$ and gate and drain terminals thereof are connected to each other. The capacitor $C_{11}$ may have one terminal configured to receive a ramp signal $V_{RAMP}$ and the other terminal connected to a gate terminal of the NMOS transistor $NM_{11}$, and the capacitor $C_{12}$ may have one terminal configured to receive a pixel signal $V_{PIXEL}$ and the other terminal connected to a gate terminal of the NMOS transistor $NM_{12}$. The NMOS transistor $NM_{11}$ may have a drain terminal connected to the drain terminal of the PMOS transistor $PM_{11}$, a gate terminal connected to the other terminal of the capacitor $C_{11}$, and a source terminal connected to the second supply voltage $V_{GND}$ through a current source and the NMOS transistor $NM_{12}$ may have a drain terminal connected to the drain terminal of the PMOS transistor $PM_{12}$, a gate terminal connected to the other terminal of the capacitor $C_{12}$, and a source terminal connected to the second supply voltage $V_{GND}$ through the current source $2I_{Tail}$. The switch $SW_{11}$ may be connected between the drain and gate terminals of the NMOS transistor $NM_{11}$, and the switch $SW_{12}$ may be connected between the gate terminal of the NMOS transistor $NM_{12}$ and the output node OUT.

The second gain acquisition and noise reduction block (or the second gain acquisition and noise reduction block) 520 may have a differential structure, receive a voltage change of the second comparison block 510 as a current gain, additionally acquire a gain by amplifying the current gain, and reduce an occurrence of banding noise and kick-back noise.

At this time, the second gain acquisition and noise reduction block 520 may include a PMOS transistor $PM_{41}$, a PMOS transistor $PM_{51}$, an NMOS transistor $NM_{51}$, and an NMOS transistor $NM_{52}$. The PMOS transistor $PM_{41}$ may have a source terminal connected to the first supply voltage $V_{DD}$, a gate terminal connected to the second comparison block 510 (i.e., the gate terminal of the PMOS transistor $PM_{11}$), and a drain terminal connected to a drain terminal of the NMOS transistor $NM_{51}$. The PMOS transistor $PM_{51}$ may have a source terminal connected to the first supply voltage $V_{DD}$, a gate terminal connected to the second comparison block 510 (i.e., the gate terminal of the PMOS transistor $PM_{12}$), and a drain terminal connected to the output node OUT. The NMOS transistor $NM_{51}$ may have a diode-connection structure in which a source terminal thereof is connected to the second supply voltage $V_{GND}$ and gate and drain terminals thereof are connected to each other. The NMOS transistor $NM_{52}$ may have a drain terminal connected to the output node OUT, a gate terminal connected to the gate terminal of the NMOS transistor $NM_{51}$, and have a source terminal connected to the second supply voltage $V_{GND}$.

Unlike the comparator of FIG. 4, the comparator of FIG. 5 may additionally include the PMOS transistor $PM_{51}$ for mirroring the current of the PMOS transistor $PM_{12}$, and pass the current of the PMOS transistor $PM_{41}$ to the path of the PMOS transistor PM51 through the NMOS transistors $NM_{51}$ and $NM_{52}$, thereby having a differential structure, so that the comparator of FIG. 5 may increase the amplification characteristic more than the comparator of FIG. 4.

Figure 6:
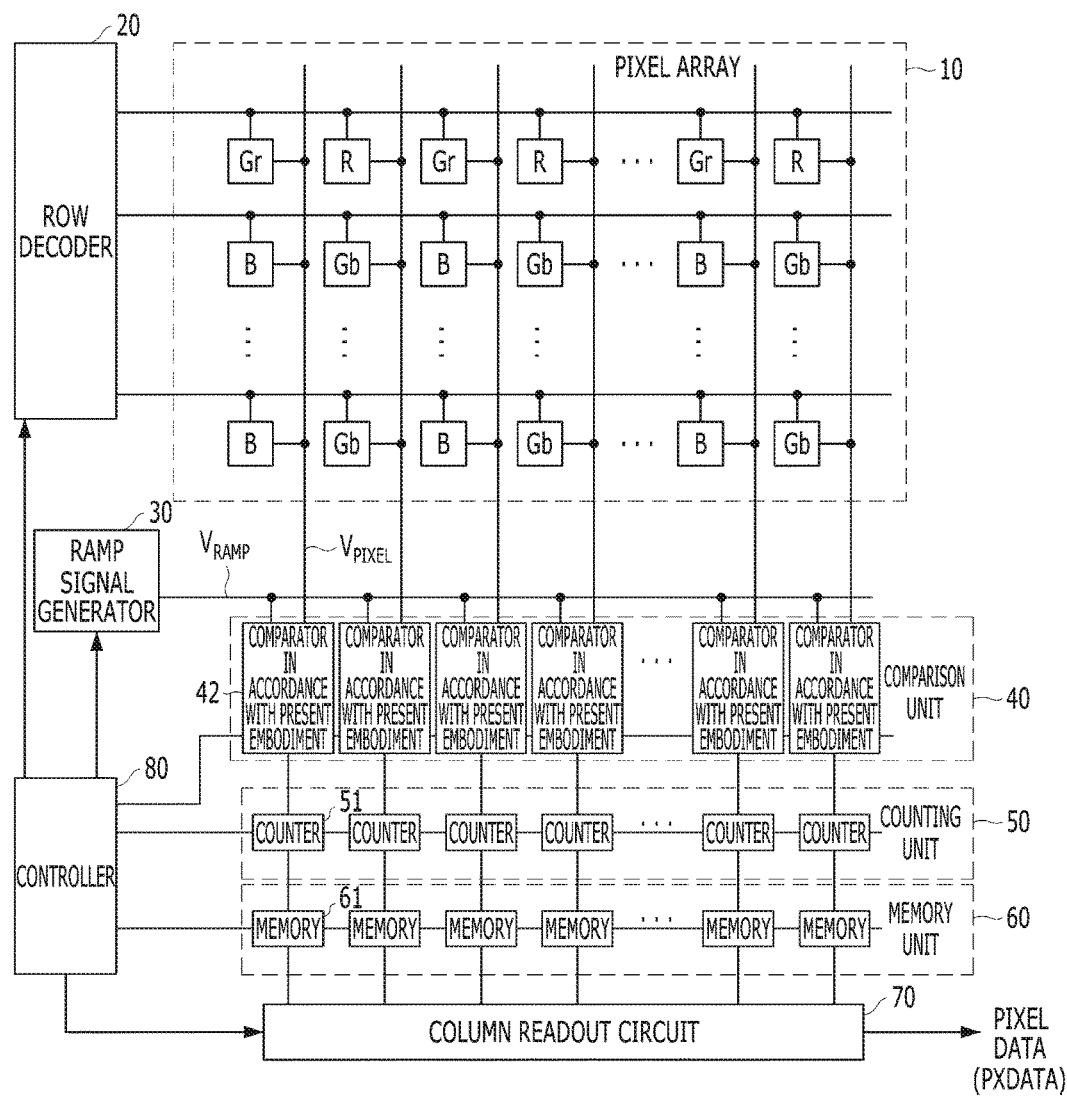
FIG. 6 is a configuration diagram illustrating a CIS in accordance with an embodiment of the present disclosure.

FIG. 6 is an exemplary configuration of a CIS in accordance with one embodiment of the present disclosure.

As illustrated in FIG. 6, the CIS in accordance with one embodiment may include a pixel array 10, a row decoder 20, a ramp signal generator 30, a comparison unit 40, a counting unit 50, a memory unit 60, a controller 80, and a column readout circuit 70. The pixel array 10 may output a pixel signal $V_{PIXEL}$ corresponding to incident light. The row decoder 20 may select pixels in the pixel array 10 for each row line and control operation of the selected pixels, according to control of the controller 80. The ramp signal generator 30 may generate a ramp signal $V_{RAMP}$ according to control of the controller 80. The comparison unit 40 may compare the value of the ramp signal $V_{RAMP}$ applied from the ramp signal generator 30 with the values of pixel signals $V_{PIXEL}$ outputted from the pixel array 10 according to control of the controller 80. The counting unit 50 may count a clock applied from the controller 80 according to each of output signals of the comparison unit 40. The memory unit 60 may store the counting information provided from the counting unit 50 according to control of the controller 80. The controller 80 may control the operations of the row decoder 20, the ramp signal generator 30, the comparison unit 40, the counting unit 50, the memory unit 60, and the column readout circuit 70. The column readout circuit 70 may sequentially output data of the memory unit 60 as pixel data PXDATA according to control of the controller 80. The comparison unit 40 may include the comparator 42 installed at each column according to one embodiment.

In another embodiment, the comparator 42 may have a configuration in which the PMOS transistors and the NMOS transistors in accordance with the above-described embodiment may be exchanged with each other.

In accordance with one embodiment, the comparator and the CIS can change a gain occurrence location and control input transistors to operate in the saturation region. Thus, the comparator and the CIS can not only reduce an occurrence of banding noise, but also increase a gain.

Furthermore, the comparator and the CIS can reduce the area and power consumption because no buffers are used, and prevent a reduction of the input swing by a gain error of a buffer.

Although various embodiments have been described for illustrative purposes, it will be apparent to those skilled in the art that various changes and modifications may be made without departing from the spirit and scope of the invention as defined in the following claims.

What is claimed is:

1. A comparator comprising:
   a comparison block suitable for comparing a ramp signal and a pixel signal and outputting a comparison signal; and
   a gain acquisition and noise reduction block suitable for amplifying the comparison signal outputted from the comparison block to acquire a gain and reduce an occurrence of noise,
   wherein the gain acquisition and noise reduction block is suitable for receiving a voltage change of the comparison block as a current gain, amplifying the voltage change to acquire an additional gain, and reducing an occurrence of banding noise and kick-back noise.

2. The comparator of claim 1, wherein the comparison block comprises:
   a first PMOS transistor having a diode-connection structure in which a source terminal thereof is connected to a first supply voltage and gate and drain terminals thereof are connected to each other;
   a second PMOS transistor having a diode-connection structure in which a source terminal thereof is connected to the first supply voltage and gate and drain terminals thereof are connected to each other;
   a first capacitor having one terminal configured to receive the ramp signal and the other terminal connected to a gate terminal of a first NMOS transistor;
   a second capacitor having one terminal configured to receive the pixel signal and the other terminal connected to a gate terminal of a second NMOS transistor;
   the first NMOS transistor having a drain terminal connected to the drain terminal of the first PMOS transistor, the gate terminal connected to the other terminal of the first capacitor, and a source terminal connected to a second supply voltage through a first current source;
   the second NMOS transistor having a drain terminal connected to the drain terminal of the second PMOS transistor, the gate terminal connected to the other terminal of the second capacitor, and a source terminal connected to the second supply voltage through the first current source;
   a first switch connected between the drain and gate terminals of the first NMOS transistor; and
   a second switch connected between the gate terminal of the second NMOS transistor and an output node.

3. The comparator of claim 2, wherein the gain acquisition and noise reduction block comprises:
   a third PMOS transistor having a source terminal connected to the first supply voltage, a gate terminal connected to the gate terminal of the first PMOS transistor, and a drain terminal connected to the output node; and
   a second current source connected between the output node and the second supply voltage.

4. The comparator of claim 1, wherein the gain acquisition and noise reduction block comprises:
   a PMOS transistor having a source terminal connected to a first supply voltage, a gate terminal connected to the comparison block, and a drain terminal connected to an output node; and
   a current source connected between the output node and a second supply voltage.

5. The comparator of claim 1, wherein the comparison block comprises:
   a first PMOS transistor having a diode-connection structure in which a source terminal thereof is connected to a first supply voltage and gate and drain terminals thereof are connected to each other;
   a second PMOS transistor having a diode-connection structure in which a source terminal thereof is connected to the first supply voltage and gate and drain terminals thereof are connected to each other;
   a first capacitor having one terminal configured to receive the ramp signal and the other terminal connected to a gate terminal of a first NMOS transistor;
   a second capacitor having one terminal configured to receive the pixel signal and the other terminal connected to a gate terminal of a second NMOS transistor;
   the first NMOS transistor having a drain terminal connected to the drain terminal of the first PMOS transistor, the gate terminal connected to the other terminal of the first capacitor, and a source terminal connected to a second supply voltage through a current source;
   the second NMOS transistor having a drain terminal connected to the drain terminal of the second PMOS transistor, the gate terminal connected to the other terminal of the second capacitor, and a source terminal connected to the second supply voltage through the current source;
   a first switch connected between the drain and gate terminals of the first NMOS transistor; and
   a second switch connected between the gate terminal of the second NMOS transistor and an output node.

6. The comparator of claim 5, wherein the gain acquisition and noise reduction block comprises:
   a third PMOS transistor having a source terminal connected to the first supply voltage, a gate terminal connected to the gate terminal of the first PMOS transistor, and a drain terminal connected to a drain terminal of a third NMOS transistor;
   a fourth PMOS transistor having a source terminal connected to the first supply voltage, a gate terminal connected to the gate terminal of the second PMOS transistor, and a drain terminal connected to the output node;
   a third NMOS transistor having a diode-connection structure in which a source terminal thereof is connected to the second supply voltage and gate and drain terminals thereof are connected to each other; and
   a fourth NMOS transistor having a drain terminal connected to the output node, a gate terminal connected to the gate terminal of the third NMOS transistor, and a source terminal connected to the second supply voltage.

7. The comparator of claim 1, wherein the gain acquisition and noise reduction block comprises:
   a first PMOS transistor having a source terminal connected to a first supply voltage, a gate terminal connected to the comparison block, and a drain terminal connected to a drain terminal of a first NMOS transistor;
   a second PMOS transistor having a source terminal connected to the first supply voltage, a gate terminal connected to the comparison block, and a drain terminal connected to an output node;

the first PMOS transistor having a diode-connection structure in which a source terminal thereof is connected to a second supply voltage and gate and drain terminals thereof are connected to each other; and a second NMOS transistor having a drain terminal connected to the output node, a gate terminal connected to the gate terminal of the first NMOS transistor, and a source terminal connected to the second supply voltage.

8. The comparator of claim 1, wherein the gain acquisition and noise reduction block has a differential structure.

9. The comparator of claim 1, wherein the comparison block comprises:

a first PMOS transistor having a diode-connection structure in which a source terminal thereof is connected to a first supply voltage and gate and drain terminals thereof are connected to each other;

a second PMOS transistor having a diode-connection structure in which a source terminal thereof is connected to the first supply voltage and gate and drain terminals thereof are connected to each other;

a first capacitor having one terminal configured to receive the ramp signal and the other terminal connected to a gate terminal of a first NMOS transistor;

a second capacitor having one terminal configured to receive the pixel signal and the other terminal connected to a gate terminal of a second NMOS transistor;

the first NMOS transistor having a drain terminal connected to the drain terminal of the first PMOS transistor, the gate terminal connected to the other terminal of the first capacitor, and a source terminal connected to a second supply voltage through a current source;

the second NMOS transistor having a drain terminal connected to the drain terminal of the second PMOS transistor, the gate terminal connected to the other terminal of the second capacitor, and a source terminal connected to the second supply voltage through the current source;

a first switch connected between the drain and gate terminals of the first NMOS transistor; and a second switch connected between the gate terminal of the second NMOS transistor and an output node.

10. The comparator of claim 9, wherein the gain acquisition and noise reduction block comprises:

a third PMOS transistor having a source terminal connected to the first supply voltage, a gate terminal connected to the gate terminal of the first PMOS transistor, and a drain terminal connected to a drain terminal of a third NMOS transistor;

a fourth PMOS transistor having a source terminal connected to the first supply voltage, a gate terminal connected to the gate terminal of the second PMOS transistor, and a drain terminal connected to the output node;

a third NMOS transistor having a diode-connection structure in which a source terminal thereof is connected to the second supply voltage and gate and drain terminals thereof are connected to each other; and a fourth NMOS transistor having a drain terminal connected to the output node, a gate terminal connected to the gate terminal of the third NMOS transistor, and a source terminal connected to the second supply voltage.

11. An image sensor comprising:

a pixel array suitable for outputting a pixel signal corresponding to incident light;

a row decoder suitable for selecting a pixel in the pixel array for each row line and controlling the selected pixel, according to control of a controller;

a ramp signal generator suitable for generating a ramp signal according to control of the controller;

a comparison block suitable for comparing the ramp signal applied from the ramp signal generator with pixel signals applied from the pixel array according to control of the controller;

a gain acquisition and noise reduction block suitable for amplifying a comparison signal applied from the comparison block to acquire a gain and reduce an occurrence of noise;

a counting unit suitable for counting a clock applied from the controller according to each of output signals from the gain acquisition and noise reduction block;

a memory unit suitable for storing counting information provided from the counting unit according to control of the controller;

the controller suitable for controlling operations of the row decoder, the ramp signal generator, the comparison block, the counting unit, the memory unit, and a column readout circuit; and the column readout circuit suitable for outputting data of the memory unit according to control of the controller, wherein the gain acquisition and noise reduction block is suitable for receiving a voltage change of the comparison block as a current gain, amplifying the voltage change to acquiring an additional gain, and reducing an occurrence of banding noise and kick-back noise.

12. The image sensor of claim 11, wherein the gain acquisition and noise reduction block comprises:

a PMOS transistor having a source terminal connected to a first supply voltage, a gate terminal connected to the comparison block, and a drain terminal connected to an output node; and a current source connected between the output node and a second supply voltage.

13. The image sensor of claim 11, wherein the gain acquisition and noise reduction block comprises:

a first PMOS transistor having a source terminal connected to a first supply voltage, a gate terminal connected to the comparison block, and a drain terminal connected to a drain terminal of a first NMOS transistor;

a second PMOS transistor having a source terminal connected to the first supply voltage, a gate terminal connected to the comparison block, and a drain terminal connected to an output node;

the first NMOS transistor having a diode-connection structure in which a source terminal thereof is connected to the second supply voltage and gate and drain terminals thereof are connected to each other; and a second NMOS transistor having a drain terminal connected to the output node, a gate terminal connected to the gate terminal of the first NMOS transistor, and a source terminal connected to the second supply voltage.

14. A comparator comprising:

a comparison block suitable for receiving a first input signal and a second input signal, and for outputting a comparison signal based on a difference value between the first and second input signals; and a gain acquisition and noise reduction block suitable for receiving a voltage change of the comparison block as a current gain and amplifying the voltage change to acquire a gain.

15. The comparator of claim 14, wherein the comparison block comprises:
   a first PMOS transistor having a diode-connection structure in which a source terminal thereof is connected to a first supply voltage and gate and drain terminals thereof are connected to each other;
   a second PMOS transistor having a diode-connection structure in which a source terminal thereof is connected to the first supply voltage and gate and drain terminals thereof are connected to each other;
   a first capacitor having one terminal configured to receive the first input signal and the other terminal connected to a gate terminal of a first NMOS transistor;
   a second capacitor having one terminal configured to receive the second input signal and the other terminal connected to a gate terminal of a second NMOS transistor;
   the first NMOS transistor having a drain terminal connected to the drain terminal of the first PMOS transistor, the gate terminal connected to the other terminal of the first capacitor, and a source terminal connected to a second supply voltage through a first current source;
   the second NMOS transistor having a drain terminal connected to the drain terminal of the second PMOS transistor, the gate terminal connected to the other terminal of the second capacitor, and a source terminal connected to the second supply voltage through the first current source;
   a first switch connected between the drain and gate terminals of the first NMOS transistor; and
   a second switch connected between the gate terminal of the second NMOS transistor and an output node.

16. The comparator of claim 15, wherein the gain acquisition and noise reduction block comprises:
   a third PMOS transistor having a source terminal connected to the first supply voltage, a gate terminal connected to the gate terminal of the first PMOS transistor, and a drain terminal connected to the output node; and
   a second current source connected between the output node and the second supply voltage.

17. The comparator of claim 14, wherein the gain acquisition and noise reduction block comprises:
   a PMOS transistor having a source terminal connected to a first supply voltage, a gate terminal connected to the comparison block, and a drain terminal connected to an output node; and
   a current source connected between the output node and a second supply voltage.

18. The comparator of claim 14, wherein the gain acquisition and noise reduction block comprises:
   a first PMOS transistor having a source terminal connected to a first supply voltage, a gate terminal connected to the comparison block, and a drain terminal connected to a drain terminal of a first NMOS transistor;
   a second PMOS transistor having a source terminal connected to the first supply voltage, a gate terminal connected to the comparison block, and a drain terminal connected to an output node;
   the first PMOS transistor having a diode-connection structure in which a source terminal thereof is connected to a second supply voltage and gate and drain terminals thereof are connected to each other; and
   a second NMOS transistor having a drain terminal connected to the output node, a gate terminal connected to the gate terminal of the first NMOS transistor, and a source terminal connected to the second supply voltage.

* * * * *